United States Patent
Leow et al.

(10) Patent No.: US 11,827,999 B2
(45) Date of Patent: Nov. 28, 2023

(54) METHODS OF FORMING SILICON CARBIDE COATED BASE SUBSTRATES AT MULTIPLE TEMPERATURES

(71) Applicant: Applied Materials, Inc., Santa Clara, CA (US)

(72) Inventors: Yen Lin Leow, Phoenix, AZ (US); Xinning Luan, Tempe, AZ (US); Hui Chen, San Jose, CA (US); Kirk Allen Fisher, Tempe, AZ (US); Shawn Thomas, Chesterfield, MO (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/146,572

(22) Filed: Jan. 12, 2021

(65) Prior Publication Data

US 2022/0220635 A1 Jul. 14, 2022

(51) Int. Cl.
*C30B 25/16* (2006.01)
*C30B 29/36* (2006.01)
(Continued)

(52) U.S. Cl.
CPC .............. *C30B 25/16* (2013.01); *C30B 25/10* (2013.01); *C30B 25/18* (2013.01); *C30B 29/36* (2013.01); *C30B 29/68* (2013.01)

(58) Field of Classification Search
CPC ......... C30B 25/00; C30B 25/02; C30B 25/10; C30B 25/14; C30B 25/16; C30B 25/165;
(Continued)

(56) References Cited

U.S. PATENT DOCUMENTS 6,300,226 B1 * 10/2001 Miyata .................. C04B 35/565
438/488
7,767,022 B1 8/2010 Gupta et al.
(Continued)

FOREIGN PATENT DOCUMENTS

EP 3514127 A1 * 7/2019 ........... C01B 32/215
EP 3514127 A1 7/2019
(Continued)

OTHER PUBLICATIONS

Wikipedia entry for "Graphite" accessed at https://en.wikipedia.org/wiki/Graphite on May 12, 2022. (Year: 2022).*
(Continued)

*Primary Examiner* — Kenneth A Bratland, Jr.
(74) *Attorney, Agent, or Firm* — Patterson + Sheridan, LLP

(57) ABSTRACT

Embodiments of the present disclosure generally relate to silicon carbide coated base substrates, silicon carbide substrates thereof, and methods for forming silicon carbide coated base substrates. In some embodiments, a method includes introducing a first silicon-containing precursor to a process chamber at a first temperature of about 800° C. to less than 1,000° C. to form a first silicon carbide layer on a base substrate. The method includes introducing a second silicon-containing precursor, that is the same or different than the first silicon-containing precursor, to the process chamber at a second temperature of about 1,000° C. to about 1,400° C. to form a second silicon carbide layer on the first silicon carbide layer.

13 Claims, 2 Drawing Sheets

(51) Int. Cl.
*C30B 29/68* (2006.01)
*C30B 25/18* (2006.01)
*C30B 25/10* (2006.01)

(58) Field of Classification Search
CPC ....... C30B 25/18; C30B 25/183; C30B 25/22; C30B 29/00; C30B 29/10; C30B 29/36; C30B 29/68; C23C 16/00; C23C 16/02; C23C 16/0272; C23C 16/029; C23C 16/22; C23C 16/32
USPC .............. 117/84, 88–89, 101, 105, 937, 951
See application file for complete search history.

(56) References Cited

U.S. PATENT DOCUMENTS

| | | | | |
|---|---|---|---|---|
| 2002/0037801 | A1* | 3/2002 | Sugihara | ................ C04B 41/87 427/249.15 |
| 2002/0096104 | A1* | 7/2002 | Yagi | ........................ C30B 19/00 117/84 |
| 2012/0270053 | A1 | 10/2012 | Villalobos et al. | |
| 2013/0168697 | A1 | 7/2013 | Kim et al. | |
| 2020/0066514 | A1 | 2/2020 | Kim et al. | |

FOREIGN PATENT DOCUMENTS

| | | |
|---|---|---|
| EP | 3514128 A1 | 7/2019 |
| EP | 3514129 A1 | 7/2019 |
| EP | 3514130 A1 | 7/2019 |
| EP | 3514257 A1 | 7/2019 |
| EP | 3514259 A1 | 7/2019 |
| EP | 3626865 A1 | 3/2020 |
| JP | 2004075493 A | 3/2004 |
| JP | 2015230998 A | 12/2015 |
| KR | 101341471 B1 | 12/2013 |
| KR | 101593922 B1 | 2/2016 |

OTHER PUBLICATIONS

Wikipedia entry for "Silicon Carbide" accessed at https://en.wikipedia.org/wiki/Silicon_carbide on May 12, 2022 (Year: 2022).*
International Search Report and Written Opinion dated Mar. 21, 2022 for Application No. PCT/US2021/061075.

* cited by examiner

METHODS OF FORMING SILICON CARBIDE COATED BASE SUBSTRATES AT MULTIPLE TEMPERATURES

BACKGROUND

Field

Embodiments of the present disclosure generally relate to silicon carbide coated substrates, silicon carbide substrates thereof, and methods for forming silicon carbide coated substrates.

Description of the Related Art

Conventional silicon carbide (SiC) (having 4H or 6H crystallinity) is made by a method known as the Lely method, which forms single crystalline SiC by sublimation. However, sublimation to form 4H or 6H SiC is a very slow process and can be cost prohibitive. In addition, the 4H or 6H SiC formed using the Lely method is single crystalline SiC which has a high resistivity. Methods to form SiC having different crystallinity are even less explored than the methods used to form 4H or 6H SiC.

Graphite can be used as a base substrate for depositing SiC. Graphite provides mechanical strength, which can be advantageous when forming SiC parts or SiC substrates (which may be used in semiconductor processing). However, because of the porosity of the graphite, the SiC can intercolate into the pores of the graphite (forming SiC "tendrils" in the pores), which makes the SiC difficult to remove from the graphite (for SiC substrate production) and promotes surface roughness of the SiC substrate that is formed when removed from the graphite substrate. The tightly bound SiC to the graphite can also form small cracks in the SiC substrate once removed, and such cracks can propogate across the SiC substrate.

In addition, upon cooling after SiC deposition onto the graphite, the cooled SiC and graphite have large stress/strain at the interface because the two materials contract at different rates upon cooling from an elevated temperature. The large stress/strain can cause warpage/bow of the SiC substrate (upon removal from the graphite). The difference in lattice constant between SiC and graphite may also accentuate or extenuate stress/strain.

There is a need for methods of forming SiC substrates (such as polycrystalline SiC substrate, such as wafers).

SUMMARY

In at least one embodiment, a method includes introducing a first silicon-containing precursor to a process chamber at a first temperature of about 800° C. to less than 1,000° C. to form a first silicon carbide layer on a base substrate. The method includes introducing a second silicon-containing precursor, that is the same or different than the first silicon-containing precursor, to the process chamber at a second temperature of about 1,000° C. to about 1,400° C. to form a second silicon carbide layer on the first silicon carbide layer.

In at least one embodiment, a method includes introducing a first silicon-containing precursor to a process chamber at a first temperature of about 1,000° C. to about 1,400° C. The method includes decreasing the first temperature to a second temperature of about 800° C. to less than 1,000° C. to form a first silicon carbide layer on a base substrate. The method includes introducing a second silicon-containing precursor, that is the same as or different than the first silicon-containing precursor, to the process chamber at a third temperature, that is the same as or different than the first temperature, of about 1,000° C. to about 1,400° C. to form a second silicon carbide layer on the first silicon carbide layer.

In at least one embodiment, a multilayer stack includes a graphite substrate and a first silicon carbide layer disposed on the graphite substrate. The multilayer stack includes a second silicon carbide layer disposed on the first silicon carbide layer. The first silicon carbide layer has a thickness of about 1 micron to about 200 microns. The second silicon carbide layer has a thickness of about 40 microns to about 1.5 millimeters.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
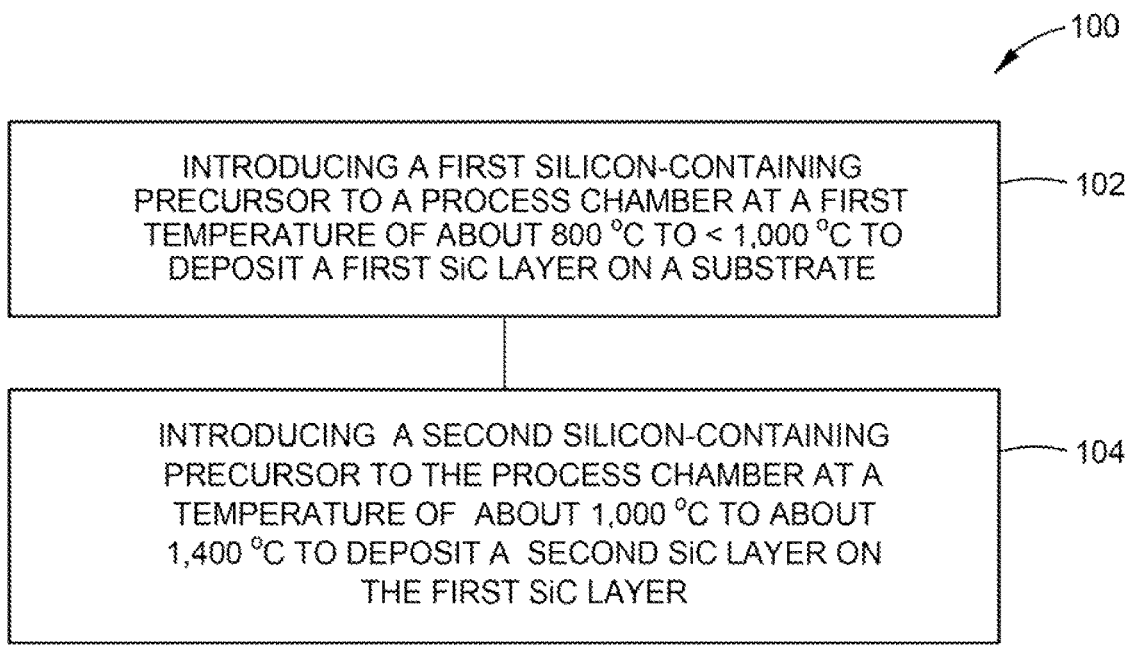
FIG. 1 is a process flow diagram of a method, according to an embodiment.

Embodiments of the present disclosure generally relate to silicon carbide coated base substrates, silicon carbide substrates thereof, and methods for forming silicon carbide coated base substrates. Silicon carbide coated base substrates (and methods thereof) can provide a buffer layer disposed between a base substrate and a polycrystalline silicon carbide layer. The buffer layer can be, for example, an amorphous silicon carbide. The buffer layer reduces stress/strain mismatch between the base substrate and polycrystalline silicon carbide layer (as compared to a polycrystalline silicon carbide disposed directly on a base substrate). The reduced stress/strain provides a number of benefits including (1) reduced warpage or bow of the polycrystalline silicon carbide (upon removal from the base substrate to form a polycrystalline silicon carbide substrate), as well as (2) decreased removal of excess silicon carbide from the polycrystalline silicon carbide to obtain a substantially flat polycrystalline silicon carbide substrate in light of the reduced warpage/bow. In some embodiments, which may be combined with other embodiments, a polycrystalline silicon carbide layer has a 3C crystallinity (e.g., cubic), which can provide lower electrical resistivity and lower cost than, for example, 4H SiC or 6H SiC formed using the Lely method.

In some embodiments, a method includes introducing a first silicon-containing precursor to a process chamber at a first temperature of about 800° C. to less than 1,000° C. to form a first silicon carbide layer on a base substrate. The method includes introducing a second silicon-containing precursor, that is the same or different than the first silicon-containing precursor, to the process chamber at a second temperature of about 1,000° C. to about 1,400° C. to form a second silicon carbide layer on the first silicon carbide layer.

In some embodiments, a method includes introducing a first silicon-containing precursor to a process chamber at a first temperature of about 1,000° C. to about 1,400° C. The method includes decreasing the first temperature to a second temperature of about 800° C. to less than 1,000° C. to form a first silicon carbide layer on a base substrate. The method includes introducing a second silicon-containing precursor, that is the same as or different than the first silicon-containing precursor, to the process chamber at a third temperature, that is the same as or different than the first temperature, of about 1,000° C. to about 1,400° C. to form a second silicon carbide layer on the first silicon carbide layer.

Examples of process chambers that may be adapted to benefit from exemplary aspects of the disclosure include the CVD chambers commercially available from Applied Materials, Inc., located in Santa Clara, California. It is contemplated that other process chambers and/or processing platforms, including those from other manufacturers, may be adapted to benefit from aspects of the disclosure.

Buffer Layer and Polycrystalline SiC Formation

In some embodiments, as shown in FIG. 1, a method 100 for forming polycrystalline silicon carbide (SiC) includes introducing 102 a first silicon-containing precursor to a process chamber (chemical vapor deposition chamber) at a first temperature (e.g., substrate temperature) of about 800° C. to less than 1,000° C. (such as about 850° C. to about 950° C., such as about 850° C. to about 900° C.) and/or a chamber pressure of about 1 millitorr to about 760 torr to deposit a first SiC layer on a base substrate. The first SiC layer can have an Si content of about 40 mol % to about 100 mol %, such as about 40 mol % to about 70 mol %, alternatively about 70 mol % to about 100 mol %. Excess silicon can provide a first SiC layer having reduced compressive strain with a base substrate (such as graphite) as compared to polycrystalline SiC deposited directly onto the base substrate.

In some embodiments, which can be combined with other embodiments, a first SiC layer has a coefficient of thermal expansion (CTE) of about $3 \times 10E\text{-}6/°$ C. to about $5 \times 10E\text{-}6/°$ C., such as about $3 \times 10E\text{-}6/°$ C. to about $4 \times 10E\text{-}6/°$ C., alternatively about $4 \times 10E\text{-}6/°$ C. to about $5 \times 10E\text{-}6/°$ C., as determined by ASTM E228-17 (Standard Test Method for Linear Thermal Expansion of Solid Materials With a Push-Rod Dilatometer). In some embodiments, which can be combined with other embodiments, a base substrate (such as graphite) has a coefficient of thermal expansion (CTE) of about $4 \times 10E\text{-}6/°$ C. to about $8 \times 10E\text{-}6/°$ C., such as about $4 \times 10E\text{-}6/°$ C. to about $6 \times 10E\text{-}6/°$ C., alternatively about $6 \times 10E\text{-}6/°$ C. to about $8 \times 10E\text{-}6/°$ C., as determined by ASTM E228-17.

In some embodiments, which can be combined with other embodiments, a first SiC layer has a lattice constant (a (Å)) of about 4 Å to about 7 Å, such as about 5 Å to about 6 Å, as determined by ASTM E1426-14 (Standard Test Method for Determining the X-Ray Elastic Constants for Use in the Measurement of Residual Stress Using X-Ray Diffraction Techniques), and/or a lattice constant (c (Å)) of about 4 Å to about 7 Å, such as about 5 Å to about 6 Å, as determined by ASTM E1426-14. In some embodiments which can be combined with other embodiments, a base substrate (such as graphite) has a lattice constant (a (Å)) of about 1 Å to about 4 Å, such as about 2 Å to about 3 Å, as determined by ASTM E1426-14, and/or a lattice constant (c (Å)) of about 5 Å to about 8 Å, such as about 6 Å to about 7 Å, as determined by ASTM E1426-14.

The first SiC layer may have a thickness of about 1 micron to less than 200 microns, such as about 20 microns to about 150 microns, such as about 30 microns to about 100 microns. The first SiC layer can be amorphous SiC. The base substrate may be any suitable base substrate such as a graphite base substrate, e.g., a graphite substrate.

A first SiC layer can act as a buffer layer that blocks tendril formation of SiC into graphite, which facilitates graphite removal from SiC during a subsequent removal process, reducing roughness of the SiC substrate that is formed, and reducing warpage or bow of the SiC substrate when graphite is removed. The reduced warpage or bow provides reduced material (e.g., the warped portions of the SiC substrate) that needs to be removed (e.g., ashed) from the SiC substrate after removal of the deposited SiC from the base substrates.

The first silicon-containing precursor can be a chlorosilane such as methyltrichlorosilane ($CH_3SiCl_3$), dimethyldichlorosilane ($Si(CH_3)_2Cl_2$), trimethylsilyl chloride (($CH_3$)$_3SiCl$), or combination(s) thereof. Alternatively, silane ($SiH_4$), trichlorosilane ($HSiCl_3$), dichlorosilane ($H_2SiCl_2$), silicon tetrachloride ($SiCl_4$), or combination(s) thereof can be used as the first silicon-containing precursor in combination with a hydrocarbon. A hydrocarbon may be propane, butane, pentane, acetylene, or combination(s) thereof. In some embodiments, which can be combined with other embodiments, a mixture of silane and a hydrocarbon is introduced to the process chamber. Additionally or alternatively, a hydrocarbon is introduced directly to the process chamber (not as a mixture with silane). In some embodiments, which can be combined with other embodiments, a ratio of silane to hydrocarbon is changed (lowered or increased) while the temperature is also changed which provides additional flexibility of the Si:C molar ratio of the deposited SiC and CTE tuning.

Hydrogen ($H_2$) or nitrogen ($N_2$) may also be introduced to the process chamber substantially concurrently with the first silicon-containing precursor. For example, a mixture of the first silicon-containing precursor and hydrogen may be introduced to the process chamber. A mixture of silicon-containing precursor and hydrogen can be obtained by introducing hydrogen to a tank containing the silicon-containing precursor, e.g. by bubbling the hydrogen through the silicon-containing precursor in the tank and passing the mixture into the process chamber. Additionally or alternatively, hydrogen is introduced directly into the process chamber (not as a mixture with silicon-containing precursor).

A flow rate of the silicon-containing precursor (or mixture containing silicon-containing precursor and/or hydrocarbon and/or hydrogen) into the process chamber can be about 2 standard liters per minute (slpm) to about 200 slpm, such as about 40 slpm to about 180 slpm, such as about 60 slpm to about 160 slpm, alternatively about 2 slpm to about 45 slpm. A flow rate can be controlled using any suitable flow meter, such as those of Sierra Instruments Digital MFC.

Methods of the present disclosure may include, during deposition of the first SiC layer, changing (e.g., increasing or decreasing) the first temperature to a second temperature such that the first layer is formed as a gradient buffer layer. Deposition of a buffer layer at a graded temperature (800°

C.-1200° C.) reduces the material mismatch caused by coefficient of thermal expansion of a base substrate (e.g., a graphite) with the subsequently deposited polycrystalline silicon carbide. For example, a buffer layer that is deposited at gradually increasing temperatures contracts less when the base substrate is eventually cooled after polycrystalline silicon carbide deposition or undergoes further thermal treatment (as compared to deposition performed without gradient temperature deposition). Increasing the temperature during deposition of the first SiC layer provides a first SiC layer having a "silicon-rich" side proximate the base substrate and a "carbonrich" side exposed (where the carbon-rich side will be proximate the second SiC layer after deposition of the second SiC layer). In contrast, decreasing the temperature during deposition of the first SiC layer provides a first SiC layer having a "carbon-rich" side proximate the base substrate and a "silicon-rich" side exposed (where the silicon rich side will be proximate the second SiC layer after deposition of the second SiC layer).

For example, in some embodiments, the silicon-rich side can have an Si content of about 50 mol % to about 100 mol %, such as about 50 mol % to about 75 mol %, alternatively about 75 mol % to about 100 mol % (as determined at a depth of the silicon-rich side of 0 micron to 1 micron), and the carbon-rich side can have a carbon content of about 50 mol % to about 100 mol %, such as about 50 mol % to about 75 mol %, alternatively about 75 mol % to about 100 mol % (as determined at a depth of the carbon-rich side of 0 micron to 1 micron).

It has been discovered that deposition at temperatures less than 1,000° C. promote silicon-rich SiC formation whereas temperatures above 1,125° C. promote carbon-rich SiC formation. Interestingly, silicon-rich and carbon-rich sides of the first SiC layer can be formed even when a single precursor is used as silicon and carbon source for forming the first SiC layer.

Additionally or alternatively to ramping the temperature during deposition of the first SiC layer, the first SiC layer can be deposited at the first temperature followed by annealing the first SiC layer at an anneal temperature. Annealing the first SiC layer may be performed at a temperature of about 1,000° C. or greater, such as about 1,000° C. to about 1,300° C., such as about 1,050° C. to about 1,200° C.

The first SiC layer can be amorphous SiC, and the increased heat (to the second temperature during deposition or by annealing after deposition) can increase the density of the first SiC layer. In some embodiments, the first SiC layer (deposited at an increased temperature) has a density of about 2.3 g/cm$^3$ to about 3.21 g/cm$^3$, as determined by ASTM C 559. A dense first SiC layer can provide a thin SiC layer without substantial tendril formation into a porous base substrate (such as graphite), improving the removal of deposited SiC from the base substrate and reduced surface roughness of deposited SiC after removal from the base substrate. In some embodiments, which may be combined with other embodiments, the deposited SiC has a surface roughness of about 0.5 micron to about 3 microns.

Method 100 further includes introducing 104 a second silicon-containing precursor (that is the same as or different than the first silicon-containing precursor) to the process chamber at a temperature (e.g., a third temperature after ramping the first temperature to the second temperature) of about 1,000° C. to about 1,400° C., such as about 1,125° C. to about 1,300° C. to deposit a second SiC layer on the first SiC layer. The second SiC layer can be polycrystalline SiC.

The second SiC layer has a Si:C molar ratio of about 0.8 to about 1.2, such as about 0.8 to about 1, such as about 0.85 to about 0.95. The second SiC layer may have a thickness of about 40 microns to about 20 millimeters, such as about 100 microns to about 1.5 millimeters, such as about 200 microns to about 400 microns. It is to be noted that other thicknesses are also contemplated.

In addition, because of the properties (e.g., density) of the first SiC layer, the first SiC layer can act as a seed layer for polycrystalline growth of the second SiC layer and control of the grain size of the polycrystalline SiC formed. In some embodiments, the second SiC layer is polycrystalline SiC having an average grain size of about 1 micron to about 100 microns, as determined by microscopy. In some embodiments, a second SiC layer has a coefficient of thermal expansion (CTE) of about 1×10E-6/° C. to about 4×10E-6/° C., such as about 2×10E-6/° C. to about 3×10E-6/° C., alternatively about 3×10E-6/° C. to about 4×10E-6/° C., as determined by ASTM E228-17 (Standard Test Method for Linear Thermal Expansion of Solid Materials With a Push-Rod Dilatometer). In some embodiments, a second SiC layer has a lattice constant (a (Å)) of about 3 Å to about 6 Å, such as about 4 Å to about 5 Å, as determined by ASTM ASTM E1426-14, and/or a lattice constant (c (Å)) of about 3 Å to about 6 Å, such as about 4 Å to about 5 Å, as determined by ASTM ASTM E1426-14.

The second silicon-containing precursor can be a chlorosilane such as methyltrichlorosilane ($CH_3SiCl_3$), dimethyldichlorosilane ($Si(CH_3)_2Cl_2$), trimethylsilyl chloride (($CH_3)_3SiCl$), or combination(s) thereof. Alternatively, silane ($SiH_4$), trichlorosilane ($HSiCl_3$), dichlorosilane ($H_2SiCl_2$), silicon tetrachloride ($SiCl_4$), or combination(s) thereof can be used as the second silicon-containing precursor in combination with a hydrocarbon. A hydrocarbon may be propane, butane, pentane, acetylene, or combination(s) thereof. In some embodiments, a mixture of silane and a hydrocarbon is introduced to the process chamber. Additionally or alternatively, a hydrocarbon is introduced directly to the process chamber (not as a mixture with silane).

Hydrogen ($H_2$) may also be introduced to the process chamber substantially concurrently with the second silicon-containing precursor. For example, a mixture of the second silicon-containing precursor and hydrogen may be introduced to the process chamber. A mixture of silicon-containing precursor and hydrogen can be obtained by introducing hydrogen to a tank containing the silicon-containing precursor, e.g. by bubbling the hydrogen through the silicon-containing precursor in the tank and passing the mixture into the process chamber. Additionally or alternatively, hydrogen is introduced directly into the process chamber (not as a mixture with silicon-containing precursor).

A flow rate of the second silicon-containing precursor (or mixture containing second silicon-containing precursor and/or hydrocarbon and/or hydrogen) into the process chamber can be about 2 slpm to about 200 slpm, about 25 slpm to about 200 slpm, such as about 40 slpm to about 180 slpm, such as about 60 slpm to about 160 slpm, alternatively about 25 slpm to about 45 slpm. A flow rate can be controlled using any suitable flow meter, such as those of Sierra Instruments Digital MFC.

Figure 2:
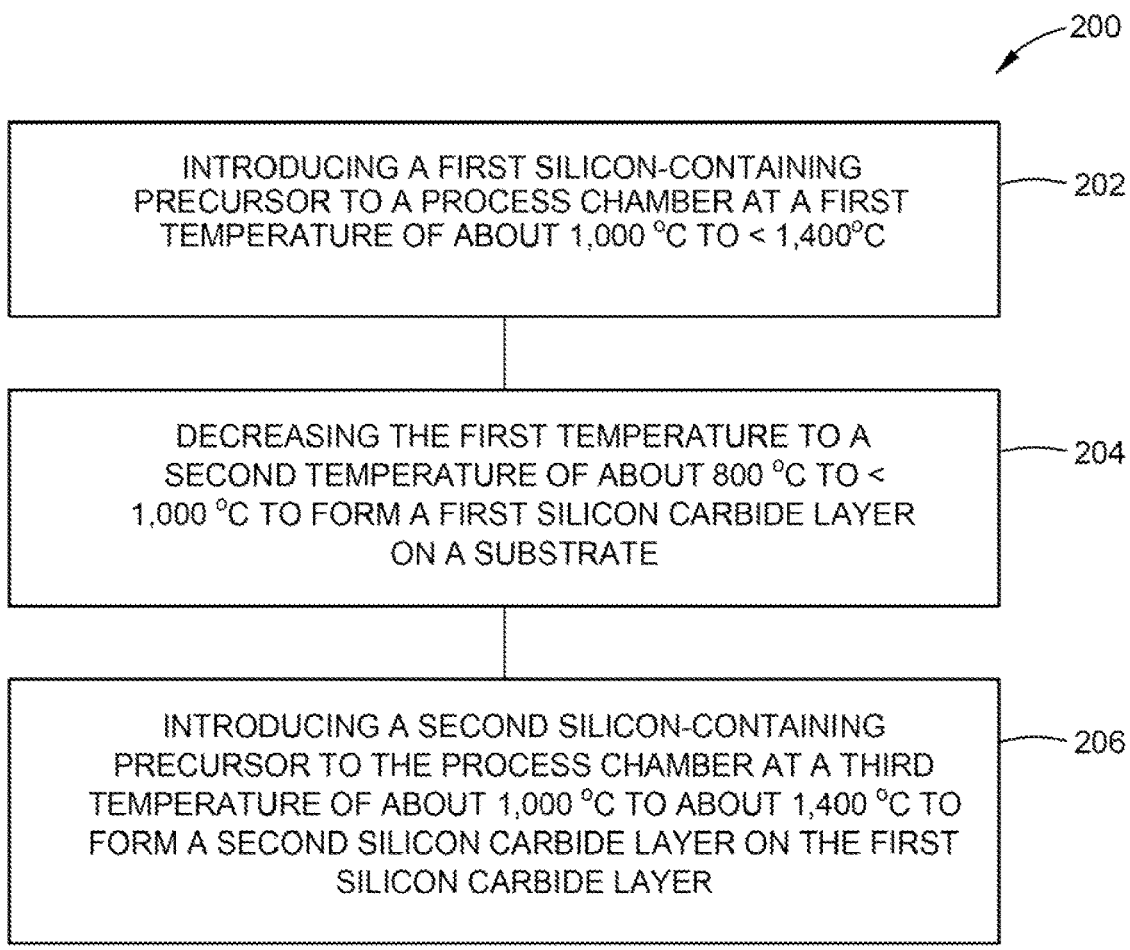
FIG. 2 is a process flow diagram of a method, according to an embodiment.

FIG. 2 is a process flow diagram of a method 200. Method 200 includes introducing 202 a first silicon-containing precursor to a process chamber at a first temperature of about 1,000° C. to about 1,400° C. Method 200 includes decreasing 204 the first temperature to a second temperature of about 800° C. to less than 1,000° C. (such as about 850° C. to about 950° C., such as about 850° C. to about 900° C.) to form a first silicon carbide layer on a base substrate. Method 200 includes introducing 206 a second silicon-containing precursor, that is the same as or different than the first silicon-containing precursor, to the process chamber at a third temperature, that is the same as or different than the first temperature, of about 1,000° C. to about 1,400° C. to form a second silicon carbide layer on the first silicon carbide layer.

Figure 3:
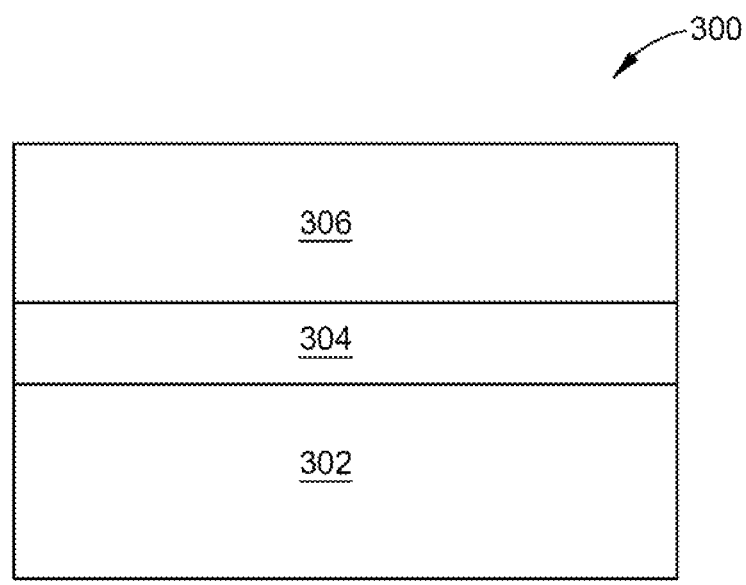
FIG. 3 is a schematic cross sectional view of a multilayer stack, according to an embodiment.

FIG. 3 is a schematic cross sectional view of a multilayer stack 300. Multilayer stack 300 includes a base substrate 302 and a first silicon carbide layer 304 disposed on the base substrate. The multilayer stack includes a second silicon carbide layer 306 disposed on the first silicon carbide layer 304. The first silicon carbide layer 304 can have a thickness of about 1 micron to less than about 200 microns. The second silicon carbide layer 306 can have a thickness of about 40 microns to about 1.5 millimeters.

Methods of the present disclosure can further include removing the deposited SiC (e.g., the second SiC layer and the first SiC layer) from the base substrate. Removing can be performed using any suitable method such as peeling, saw cutting, $O_2$ ashing, or combination(s) thereof. For example, $O_2$ ashing can include plasma or thermal $O_2$ ashing that decomposes organic portions of a sample. For example, graphite can react with oxygen to decompose while SiC is substantially (if not completely) unreacted. $O_2$ ashing may be performed at a temperature of about 600° C. to about 1,000° C.

Because processes of the present disclosure provide deposited SiC (e.g., the second SiC layer and the first SiC layer) on a base substrate with reduced stress/strain between the SiC and base substrate, annealing of the deposited SiC is merely optional. However, in some embodiments, the deposited SiC may be annealed. For example, an anneal process can be performed after CVD deposition, which is able to release the thermal stress on SiC layer. Annealing the deposited SiC can be performed before or after removing the deposited SiC from the base substrate. Annealing the deposited SiC may be performed at a temperature of about 1,000° C. or greater, such as about 1,000° C. to about 1,300° C., such as about 1,050° C. to about 1,200° C. In some embodiments, the second SiC layer (of the deposited SiC)(after annealing) has a density of about 2.3 $g/cm^3$ to about 3.21 $g/cm^3$ as determined by ASTM C 559.

After removing the deposited SiC, the first SiC layer can be removed from the second SiC layer, for example, by $O_2$ ashing, saw cutting, or the like. Because the first SiC layer can be thin, the amount of SiC removed from the second SiC layer is much less than would be removed using conventional SiC deposition techniques, for example, due to reduced "tendril" formation. $O_2$ ashing can include exposing the first SiC layer (after removal from the graphite base substrate) to oxygen plasma. Oxygen plasma may be formed in a remote plasma source or formed in situ in a process chamber.

Processes of the present disclosure also provide polycrystalline SiC substrates (with or without the first SiC layer remaining) having reduced warpage or bow as compared to conventional as-deposited SiC substrate. In some embodiments, a polycrystalline SiC substrate of the present disclosure has a degree of warpage and/or bow (as-deposited and removed from the base substrate) of about 50 microns to about 1 millimeter, as determined by ASTM F534 (Standard Test Method for Bow of Silicon).

A polycrystalline SiC substrate of the present disclosure has a lower resistivity than a single crystalline SiC substrate. In some embodiments, a polycrystalline SiC substrate has a resistivity of about 0.005 ohm-cm to about 50 ohm-cm, as determined by ASTM F1529-97 Standard Test Method for Sheet Resistance Uniformity Evaluation by In-Line Four-Point Probe with the Dual-Configuration Procedure.

Graphite Base Substrates

A graphite base substrate can be prepared from any suitable graphite element, such as by cutting the graphite into the desired size and shape.

In some embodiments, a graphite base substrate has a purity of at least 99%.

A graphite base substrate can have small pores, such as having an average pore size (pore diameters) of about 0.4 to about 5 μm. A graphite base substrate may have a surface pore diameter of about 10 μm or less. A graphite base substrate may have a degree of porosity of about 6% to about 15%, such as about 6% to about 13%, such as about 9% to about 11.5%.

A graphite can have a fine grain type, super fine grain type, and/or ultra fine grain type. Such graphite grain types indicate graphite having particularly fine grain sizes. In some embodiments, a graphite has an average grain size of about 0.05 mm or less, such as about 0.04 mm or less, such as about 0.03 mm or less, such as about 0.015 mm or less.

A graphite base substrate may have a density of about 1.5 $g/cm^3$ or greater, such as 1.7 $g/cm^3$ or greater, such as 1.75 $g/cm^3$ or greater.

The grain size, pore size/diameter, and the degree of porosity can be determined using scanning electron microscopy (SEM) measurement. The porosity may be obtained by calculating the product of the amount of pores per unit weight ($cm^3/g$) of the graphite base substrate and the bulk density ($g/cm^3$). Accordingly, the porosity can be expressed on a volume basis as [vol/vol].

The (bulk) density can be obtained by dividing the mass of a graphite sample by the volume of said sample.

Silicon Carbide Coated Base Substrates

The present disclosure further provides silicon carbide coated base substrates. The silicon carbide coated base substrates may be formed using methods of the present disclosure. For example, silicon carbide coated base substrates can be produced in embodiments where the deposited SiC (e.g., the second SiC layer and the first SiC layer) is not removed from the base substrate after SiC deposition.

In some embodiments, a base substrate is any suitable component of a process chamber. For example, a base substrate may be a wafer carrier, a susceptor, a lift pin, or a pre-heat ring.

Additional Aspects

The present disclosure provides, among others, the following aspects, each of which may be considered as optionally including any alternate aspects.

Clause 1. A method, comprising:
  introducing a first silicon-containing precursor to a process chamber at a first temperature of about 800° C. to less than 1,000° C. to form a first silicon carbide layer on a base substrate; and
  introducing a second silicon-containing precursor, that is the same as or different than the first silicon-containing precursor, to the process chamber at a second temperature of about 1,000° C. to about 1,400° C. to form a second silicon carbide layer on the first silicon carbide layer.

Clause 2. The method of Clause 1, wherein the first silicon carbide layer is amorphous and the second silicon carbide layer is polycrystalline.

Clause 3. The method of Clauses 1 or 2, wherein the second silicon carbide layer has 3C crystallinity.

Clause 4. The method of any of Clauses 1 to 3, wherein the base substrate is a graphite.

Clause 5. The method of any of Clauses 1 to 4, wherein the first temperature is about 850° C. to about 950° C.

Clause 6. The method of any of Clauses 1 to 5, wherein the second temperature is about 1,125° C. to about 1,300° C.

Clause 7. The method of any of Clauses 1 to 6, further comprising increasing the first temperature to a third temperature while forming the first silicon carbide layer.

Clause 8. The method of any of Clauses 1 to 7, wherein the third temperature is about 1,125° C. to about 1,200° C.

Clause 9. The method of any of Clauses 1 to 8, wherein the first silicon-carbide layer has:
- a first side proximate the base substrate, the first side having an Si content of about 50 mol % to about 100 mol %, such as about 50 mol % to about 75 mol %, alternatively about 75 mol % to about 100 mol % (as determined at a depth of the first side of 0 micron to 1 micron), and
- a second side proximate the second silicon carbide layer, the second side having a carbon content of about 50 mol % to about 100 mol %, such as about 50 mol % to about 75 mol %, alternatively about 75 mol % to about 100 mol % (as determined at a depth of the second side of 0 micron to 1 micron).

Clause 10. The method of any of Clauses 1 to 9, wherein the first silicon carbide layer has an Si content of about 75 mol % to about 100 mol %.

Clause 11. The method of any of Clauses 1 to 10, wherein the first silicon carbide layer has a density of about 2.3 g/cm$^3$ to about 3.21 g/cm$^3$, as determined by ASTM C 559.

Clause 12. The method of any of Clauses 1 to 11, wherein:
- the first silicon carbide layer has a coefficient of thermal expansion of about 3×10E-6/° C.) to about 5×10E-6/° C., as determined by ASTM E228-17; and
- the base substrate has a coefficient of thermal expansion of about 4×10E-6/° C. to about 8×10E-6/° C., as determined by ASTM E228-17.

Clause 13. The method of any of Clauses 1 to 12, wherein the second silicon carbide layer has a coefficient of thermal expansion (CTE) of about 1×10E-6/° C. to about 4×10E-61° C., as determined by ASTM E228-17.

Clause 14. The method of any of Clauses 1 to 13, wherein:
- the first silicon carbide layer has a lattice constant (a (Å)) of about 4 Å to about 7 Å, as determined by ASTM E1426-14 and a lattice constant (c (Å)) of about 4 Å to about 7 Å, as determined by ASTM E1426-14; and
- the base substrate has a lattice constant (a (Å)) of about 1 Å to about 4 Å, as determined by ASTM E1426-14, and a lattice constant (c (Å)) of about 5 Å to about 8 Å, as determined by ASTM E1426-14.

Clause 15. The method of any of Clauses 1 to 14, wherein the second silicon carbide layer has a lattice constant (a (Å)) of about 3 Å to about 6 Å, as determined by ASTM E1426-14, and a lattice constant (c (Å)) of about 3 Å to about 6 Å, as determined by ASTM E1426-14.

Clause 16. The method of any of Clauses 1 to 15, wherein:
- the first silicon carbide layer has a thickness of about 1 micron to less than about 200 microns; and
- the second silicon carbide layer has a thickness of about 40 microns to about 1.5 millimeters.

Clause 17. The method of any of Clauses 1 to 16, wherein the first silicon-containing precursor is dimethyldichlorosilane.

Clause 18. The method of any of Clauses 1 to 17, further comprising introducing hydrogen to the process chamber substantially concurrently with the first silicon-containing precursor.

Clause 19. The method of any of Clauses 1 to 18, wherein:
- the first silicon-containing precursor is $SiH_4$; and
- the method further comprises introducing a hydrocarbon to the process chamber substantially concurrently with the first silicon-containing precursor.

Clause 20. The method of any of Clauses 1 to 19, wherein the hydrocarbon is propane.

Clause 21. The method of any of Clauses 1 to 20, further comprising removing the first silicon carbide layer and the second silicon carbide layer from the base substrate to form a silicon carbide substrate, wherein the silicon carbide substrate has a degree of warpage or bow of about 50 microns to about 1 millimeter, as determined by ASTM F534.

Clause 22. The method of any of Clauses 1 to 21, wherein the base substrate is selected from the group consisting of a wafer carrier, a susceptor, a lift pin, and combination(s) thereof.

Clause 23. A method, comprising:
- introducing a first silicon-containing precursor to a process chamber at a first temperature of about 1,000° C. to about 1,400° C.;
- decreasing the first temperature to a second temperature of about 800° C. to <1,000° C. to form a first silicon carbide layer on a base substrate; and
- introducing a second silicon-containing precursor, that is the same as or different than the first silicon-containing precursor, to the process chamber at a third temperature, that is the same as or different than the first temperature, of about 1,000° C. to about 1,400° C. to form a second silicon carbide layer on the first silicon carbide layer.

Clause 24. The method of Clause 23, wherein the base substrate is a graphite.

Clause 25. The method of Clauses 23 or 24, wherein the second temperature is about 850° C. to about 950° C.

Clause 26. The method of any of Clauses 23 to 25, wherein the first temperature is about 1,125° C. to about 1,300° C.

Clause 27. The method of any of Clauses 23 to 26, wherein the first silicon-carbide layer has:
- a first side proximate the base substrate, the first side having an Si content of about 50 mol % to about 100 mol %, such as about 50 mol % to about 75 mol %, alternatively about 75 mol % to about 100 mol % (as determined at a depth of the first side of 0 micron to 1 micron), and
- a second side proximate the second silicon carbide layer, the second side having a carbon content of about 50 mol % to about 100 mol %, such as about 50 mol % to about 75 mol %, alternatively about 75 mol % to about 100 mol % (as determined at a depth of the second side of 0 micron to 1 micron).

Clause 28. The method of any of Clauses 23 to 27, wherein the base substrate is selected from the group consisting of a wafer carrier, a susceptor, a lift pin, and combination(s) thereof.

Clause 29. A multilayer stack, comprising:
- a base substrate;
- a first silicon carbide layer disposed on the base substrate; and
- a second silicon carbide layer disposed on the first silicon carbide layer, wherein:
  - the first silicon carbide layer has a thickness of about 1 micron to less than about 200 microns, and
  - the second silicon carbide layer has a thickness of about 40 microns to about 1.5 millimeters.

Clause 30. The multilayer stack of Clause 29, wherein:
the first silicon carbide layer has a coefficient of thermal expansion of about $3\times10E-6/°$ C. to about $5\times10E-6/°$ C., as determined by ASTM E228-17; and
the base substrate has a coefficient of thermal expansion of about $4\times10E-6/°$ C. to about $8\times10E-6/°$ C., as determined by ASTM E228-17.

Clause 31. The multilayer stack of Clauses 29 or 30, wherein the second silicon carbide layer has a coefficient of thermal expansion (CTE) of about $1\times10E-6/°$ C. to about $4\times10E-6/°$ C., as determined by ASTM E228-17.

Clause 32. The multilayer stack of any of Clauses 29 to 31, wherein:
the first silicon carbide layer has a lattice constant (a (Å)) of about 4 Å to about 7 Å, as determined by ASTM E1426-14 and a lattice constant (c (Å)) of about 4 Å to about 7 Å, as determined by ASTM E1426-14; and
the base substrate has a lattice constant (a (Å)) of about 1 Å to about 4 Å, as determined by ASTM E1426-14, and a lattice constant (c (Å)) of about 5 Å to about 8 Å, as determined by ASTM E1426-14.

Clause 33. The multilayer stack of any of Clauses 29 to 32, wherein the second silicon carbide layer has a lattice constant (a (Å)) of about 3 Å to about 6 Å, as determined by ASTM E1426-14, and a lattice constant (c (Å)) of about 3 Å to about 6 Å, as determined by ASTM E1426-14.

Clause 34. The multilayer stack of any of Clauses 29 to 33, wherein the first silicon carbide layer is amorphous and the second silicon carbide layer is polycrystalline.

Clause 35. The multilayer stack of any of Clauses 29 to 34, wherein the first silicon-carbide layer has:
a first side proximate the base substrate, the first side having an Si content of about 50 mol % to about 100 mol %, such as about 50 mol % to about 75 mol %, alternatively about 75 mol % to about 100 mol % (as determined at a depth of the first side of 0 micron to 1 micron), and
a second side proximate the second silicon carbide layer, the second side having a carbon content of about 50 mol % to about 100 mol %, such as about 50 mol % to about 75 mol %, alternatively about 75 mol % to about 100 mol % (as determined at a depth of the second side of 0 micron to 1 micron).

Clause 36. The method of any of Clauses 29 to 35, wherein the first silicon carbide layer is amorphous and the second silicon carbide layer is polycrystalline.

Clause 37. The method of any of Clauses 29 to 36, wherein the base substrate is a graphite.

Clause 38. The method of any of Clauses 29 to 37, wherein the first silicon-carbide layer has:
a first side proximate the base substrate, the first side having an Si content of about 50 mol % to about 100 mol %, such as about 50 mol % to about 75 mol %, alternatively about 75 mol % to about 100 mol % (as determined at a depth of the first side of 0 micron to 1 micron), and
a second side proximate the second silicon carbide layer, the second side having a carbon content of about 50 mol % to about 100 mol %, such as about 50 mol % to about 75 mol %, alternatively about 75 mol % to about 100 mol % (as determined at a depth of the second side of 0 micron to 1 micron).

Clause 39. The method of any of Clauses 29 to 38, wherein the first silicon carbide layer has an Si content of about 40 mol % to about 100 mol %, such as about 40 mol % to about 70 mol %, alternatively about 70 mol % to about 100 mol %.

Clause 40. The method of any of Clauses 29 to 39, wherein the first silicon carbide layer has a density of about 2.3 g/cm$^3$ to about 3.21 g/cm$^3$, as determined by ASTM C 559.

Overall, the present disclosure provides methods for forming polycrystalline silicon carbide coated base substrates. Silicon carbide base substrates (and methods thereof) can provide a buffer layer disposed between a base substrate and a polycrystalline silicon carbide layer. The buffer layer can be, for example, an amorphous silicon carbide. The buffer layer reduces stress/strain mismatch between the base substrate and polycrystalline silicon carbide layer (as compared to a polycrystalline silicon carbide disposed directly on a base substrate). The reduced stress/strain provides a number of benefits including (1) reduced warpage or bow of the polycrystalline silicon carbide (upon removal from the base substrate to form a polycrystalline silicon carbide substrate), as well as (2) decreased removal of excess silicon carbide from the polycrystalline silicon carbide to obtain a substantially flat polycrystalline silicon carbide substrate in light of the reduced warpage or bow.

While the foregoing is directed to embodiments of the present disclosure, other and further embodiments of the disclosure may be devised without departing from the basic scope thereof.

What is claimed is:

1. A method, comprising:
introducing a first silicon-containing precursor to a process chamber at a first temperature of 800° C. to less than 1,000° C. to form an amorphous first silicon carbide layer having a thickness of 1 micron to 200 microns on a base substrate; and
introducing a second silicon-containing precursor, that is the same as or different than the first silicon-containing precursor, to the process chamber at a second temperature of 1,000° C. to 1,400° C. to form a polycrystalline second silicon carbide layer having a thickness of 40 microns to 1.5 millimeters on the amorphous first silicon carbide layer.

2. The method of claim 1, wherein the base substrate is a graphite.

3. The method of claim 1, wherein:
the first temperature is 850° C. to 950° C., and
the second temperature is 1,125° C. to 1,300° C.

4. The method of claim 1, further comprising increasing the first temperature to a third temperature while introducing the first silicon-containing precursor to the process chamber.

5. The method of claim 4, wherein the third temperature is 1,125° C. to 1,200° C.

6. The method of claim 4, wherein the first silicon-carbide layer has:
a first side proximate the base substrate, the first side having an Si content of 50 mol % to 100 mol % (as determined at a depth of the first side of 0 micron to 1 micron), and
a second side proximate the second silicon carbide layer, the second side having a carbon content of 50 mol % to about 100 mol % (as determined at a depth of the second side of 0 micron to 1 micron).

7. The method of claim 1, wherein the first silicon carbide layer has a carbon content of 50 mol % to 100 mol %.

8. The method of claim 1, wherein the first silicon carbide layer has a density of 2.3 g/cm$^3$ to 3.21 g/cm$^3$, as determined by ASTM C 559.

9. The method of claim 1, wherein:
the first silicon carbide layer has a coefficient of thermal expansion between of $3\times10E-6/°$ C. to $5\times10E-6/°$ C., as determined by ASTM E228-17; and the base substrate has a coefficient of thermal expansion of 4×10E-6/° C. to 8×10E-6/° C., as determined by ASTM E228-17.

10. The method of claim 9, wherein the second silicon carbide layer has a coefficient of thermal expansion (CTE) of 1×10E-6/° C. to 4×10E-6/° C., as determined by ASTM E228-17.

11. The method of claim 1, wherein:
the first silicon carbide layer has a lattice constant (a (Å)) of 4 Å to 7 Å, as determined by ASTM E1426-14 and a lattice constant (c (Å)) of 4 Å to 7 Å, as determined by ASTM E1426-14; and
the base substrate has a lattice constant (a (Å)) of 1 Å to 4 Å, as determined by ASTM E1426-14, and a lattice constant (c (Å)) of 5 Å to 8 Å, as determined by ASTM E1426-14.

12. The method of claim 11, wherein the second silicon carbide layer has a lattice constant (a (Å)) of 3 Å to 6 Å, as determined by ASTM E1426-14, and a lattice constant (c (Å)) of 3 Å to 6 Å, as determined by ASTM E1426-14.

13. The method of claim 1, wherein:
the first silicon carbide layer has a thickness of 1 micron to less than 200 microns; and
the second silicon carbide layer has a thickness of 40 microns to 1.5 millimeters.

* * * * *